(12) United States Patent
Hellweg et al.

(10) Patent No.: US 10,948,637 B2
(45) Date of Patent: Mar. 16, 2021

(54) METROLOGY SYSTEM HAVING AN EUV OPTICAL UNIT

(71) Applicant: Carl Zeiss SMT GmbH, Oberkochen (DE)

(72) Inventors: Dirk Hellweg, Langenau (DE); Stefan Mueller, Oberkochen (DE); Ralf Gehrke, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 231 days.

(21) Appl. No.: 16/026,192

(22) Filed: Jul. 3, 2018

(65) Prior Publication Data

US 2019/0011615 A1 Jan. 10, 2019

(30) Foreign Application Priority Data

Jul. 5, 2017 (DE) .......................... 102017211443.6

(51) Int. Cl.
| | |
|---|---|
| G02B 5/20 | (2006.01) |
| G03F 7/20 | (2006.01) |
| G01N 21/956 | (2006.01) |
| G03F 1/84 | (2012.01) |

(52) U.S. Cl.
CPC ........... *G02B 5/208* (2013.01); *G01N 21/956* (2013.01); *G02B 5/205* (2013.01); *G03F 1/84* (2013.01); *G03F 7/70625* (2013.01)

(58) Field of Classification Search
CPC .......... G02B 5/20; G02B 5/205; G02B 5/208; G02B 5/285; G02B 5/0891; G02B 7/20; G02B 17/08; G02B 17/0892; G02B 17/0896; G02B 1/115; G02B 1/118; G02B 27/09; G02B 27/22; G03F 1/84; G03F 7/70625; G01N 21/956

USPC ................. 359/359–361, 350, 351, 589, 614
See application file for complete search history.

(56) References Cited

U.S. PATENT DOCUMENTS

| | | |
|---|---|---|
| 9,195,130 B2 | 11/2015 | Yamada et al. |
| 2010/0195076 A1 | 8/2010 | Mueller et al. |
| 2012/0069313 A1 | 3/2012 | Schmidts et al. |
| 2013/0063716 A1 | 3/2013 | Mann et al. |
| 2013/0083321 A1 | 4/2013 | Wack et al. |
| 2014/0347721 A1 | 11/2014 | Bittner et al. |
| 2016/0170201 A1 | 6/2016 | Holz et al. |

(Continued)

FOREIGN PATENT DOCUMENTS

| | | |
|---|---|---|
| DE | 102 20 815 | 11/2003 |
| DE | 102 20 816 | 11/2003 |
| DE | 102008041436 | 4/2004 |

(Continued)

OTHER PUBLICATIONS

The Notice of Reasons for Rejection for Japanese Patent Application No. JP 2018-128123 dated May 10, 2019.

(Continued)

*Primary Examiner* — Jie Lei
(74) *Attorney, Agent, or Firm* — Fish & Richardson P.C.

(57) ABSTRACT

An EUV greyscale filter of an EUV optical unit of a metrology system has a membrane that is at least partly transmissive in regions for EUV light in the wavelength range of between 5 nm and 30 nm. The latter interacts with a whole beam of the EUV light in the operational position of the EUV greyscale filter. This results in a metrology system with extended application possibilities on account of the EUV greyscale filter.

20 Claims, 4 Drawing Sheets

(56) References Cited

U.S. PATENT DOCUMENTS

2017/0131528 A1   5/2017  Ruoff et al.

FOREIGN PATENT DOCUMENTS

| | | |
|---|---|---|
| DE | 102008021833 | 7/2009 |
| DE | 102012204295 | 3/2013 |
| DE | 102012202057 | 8/2013 |
| EP | 0 952 491 | 10/1999 |
| JP | 63-140530 | 6/1988 |
| JP | 2006-73620 | 3/2006 |
| JP | 2008-66345 | 3/2008 |
| JP | 2012-522358 | 9/2012 |
| JP | 2013-80810 | 5/2013 |
| WO | WO 2009/024164 | 2/2009 |
| WO | WO 2010/108516 | 9/2010 |
| WO | WO 2013/167409 | 11/2013 |
| WO | WO 2015/028450 | 3/2015 |
| WO | WO 2016/012426 | 1/2016 |

OTHER PUBLICATIONS

The Japanese Office Action for Japanese Patent Application No. JP 2018-128123 dated Mar. 3, 2020 (with English Translation).

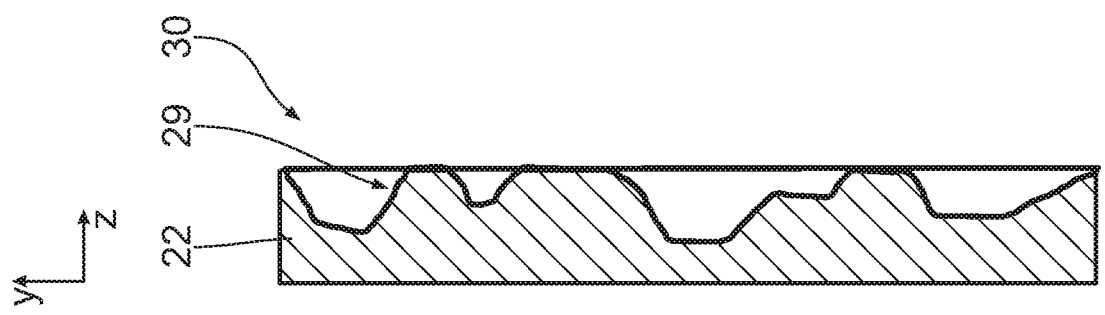
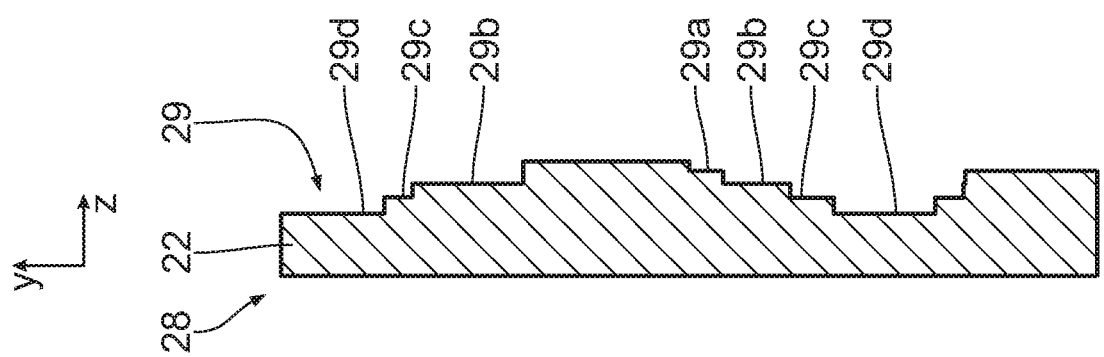
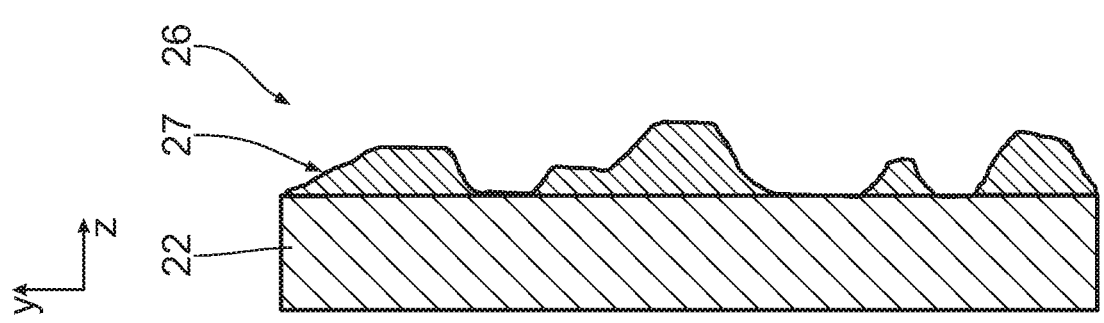
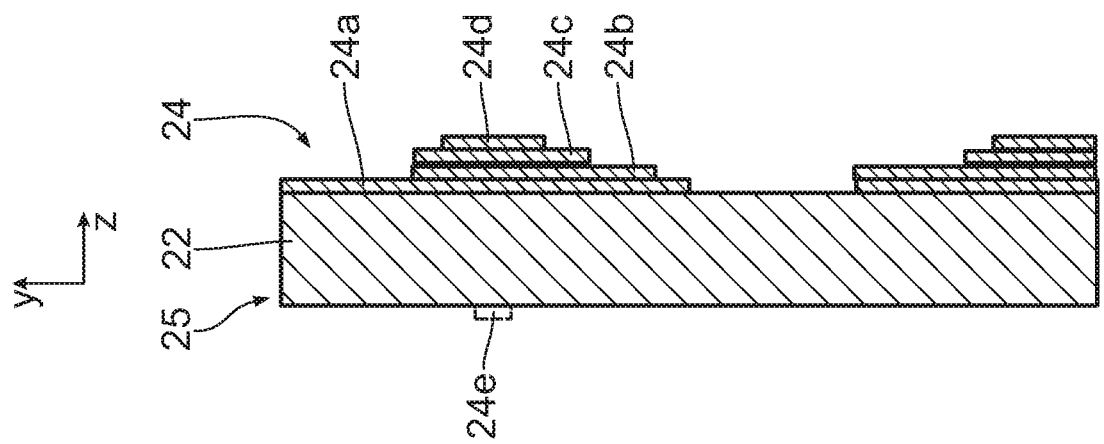

METROLOGY SYSTEM HAVING AN EUV OPTICAL UNIT

CROSS REFERENCE TO RELATED APPLICATIONS

This application claims priority under 35 U.S.C. § 119 to German Application DE 10 2017 211 443.6, filed on Jul. 5, 2017, the entire content of which is incorporated herein by reference in its entirety.

TECHNICAL FIELD

The invention relates to a metrology system having an EUV optical unit.

BACKGROUND

Such metrology systems are known from WO 2016/012426 A1, US 2013/0063716 A1, DE 102 20 815 A1, DE 102 20 816 A1 and US 2013/0083321 A1. DE 10 2012 204 295 A1 discloses a filter element for a projection exposure apparatus. DE 10 2008 041 436 A1 describes an optical membrane element for an optical appliance in EUV lithography.

SUMMARY

In a general aspect, the invention provides a metrology system having an EUV greyscale filter with a membrane (22) that is at least partly transmissive in regions for EUV light in the wavelength range of between 5 nm and 30 nm, said membrane interacting with a whole beam of the EUV light in the operational position of the EUV greyscale filter, in which at least two different transmission levels are realized over the varying layer thickness.

According to the invention, it was recognized that thin membranes, which are currently proposed for pellicles for EUV masks, are also suitable, in principle, for constructing an EUV greyscale filter. Such pellicle structures are known from U.S. Pat. No. 9,195,130 B2. EUV filters are known as stops in the prior art. Further types of an EUV filter are known from US 2012/0069313 A1 and from DE 10 2012 202 057 A1.

The membrane of the greyscale filter has no apertures or perforations, through which the EUV light can pass the membrane without interaction. The membrane can have a layer thickness in the range between 10 nm and 100 nm. The membrane can be unsupported within the meaning of not being supported, i.e., not being applied to a membrane carrier, where it interacts with the beam of the EUV light. Alternatively, the membrane can be applied to a carrying mesh. The carrying mesh can be formed by thin wires that are connected to the membrane. The mesh can be configured as a fabric.

The membrane can be manufactured from at least one of the following basic materials: polycrystalline silicon, monocrystalline silicon, silicon nitride, zirconium or on the basis of carbon, e.g., graphene or carbon nanotubes.

The EUV optical unit can be embodied as an illumination optical unit of a metrology system or else as a projection optical unit of a metrology system. The EUV greyscale filter can be arranged in, or in the vicinity of, a pupil plane of the EUV optical unit, i.e., in, or in the vicinity of, a pupil plane of the illumination optical unit or in, or in the vicinity of, a pupil plane of the projection optical unit. The illumination optical unit can have at least one MEMS (microelectromechanical systems) mirror for finely influencing an illumination intensity distribution in a pupil plane of the optical unit. A corresponding MEMS or MOEMS (micro-opto-electromechanical systems) concept within the scope of an illumination optical unit is known from, e.g., WO 2015/028450 A1 and WO 2013/167409 A1, and the references cited therein.

Different transmission levels, realized by way of a varying layer thickness, can be produced with comparatively little outlay. By way of example, it is possible for two or three, or else more, of such transmission levels to be present in the EUV greyscale filter. As an alternative to transmission levels, a continuously varying layer thickness of the EUV greyscale filter with a correspondingly continuous transmission profile can also be present. A realization of at least two different transmission levels over a varying layer thickness may also occur in a variant of the greyscale filter in which there is a material ablation for producing the varying layer thickness.

A maximum transmission according to that is greater than 60% in a membrane maximum transmission surface region leads to advantageously low transmission losses where no attenuation of the EUV light is required. The maximum transmission of the membrane can be greater than 65%, can be greater than 0%, can be greater than 75%, can be greater than 80%, can be greater than 85% and can also be greater than 90%. The maximum transmission is regularly less than 95%.

A patterning of the membrane surface of the EUV greyscale filter for varying an absorption or reflectivity over the surface of the membrane can be achieved, for example, by a targeted material ablation in regions. A result of the patterning can be a varying membrane thickness and, in particular, a continuously varying membrane thickness. A result of the patterning can be alternative or additional membrane regions, at least two different transmission levels being realized on account of the different membrane thicknesses of said regions. The membrane surface can be patterned from only one side of the membrane or else from both sides of the membrane.

A coating of the membrane surface of the EUV greyscale filter for varying an absorption or reflectivity over the surface of the membrane can be implemented as an alternative, or in addition, to the patterning explained above. The coating can also be implemented from only one side or from both sides of the membrane. The coating can be implemented with silicon nitride, ruthenium, chromium, zirconium, SiO2, palladium, molybdenum, silicon, tantalum, tantalum nitride, TaON, titanium, titanium nitride, gold, nickel, or boron.

A varying layer thickness in the coating of the membrane surface facilitates the prescription of a correspondingly varying absorption or transmission profile of the EUV greyscale filter.

Arrangement variants of the EUV greyscale filter in which the EUV greyscale filter is arranged in a pupil plane or a field plane of the EUV optical unit are advantageous, depending on the application of the filter. An arrangement in an intermediate plane, which is neither near the pupil nor near the field, is also possible, for example when using the greyscale filter as a Bertrand manipulator.

DESCRIPTION OF DRAWINGS

An exemplary embodiment of the invention is explained in greater detail below with reference to the drawings. In said drawings:

FIGS. 6 to 9 show sectional illustrations similar to FIG. 5 of further embodiments of EUV greyscale filters, which can be used instead of the greyscale filter according to FIGS. 4 and 5.

DETAILED DESCRIPTION

Figure 1:
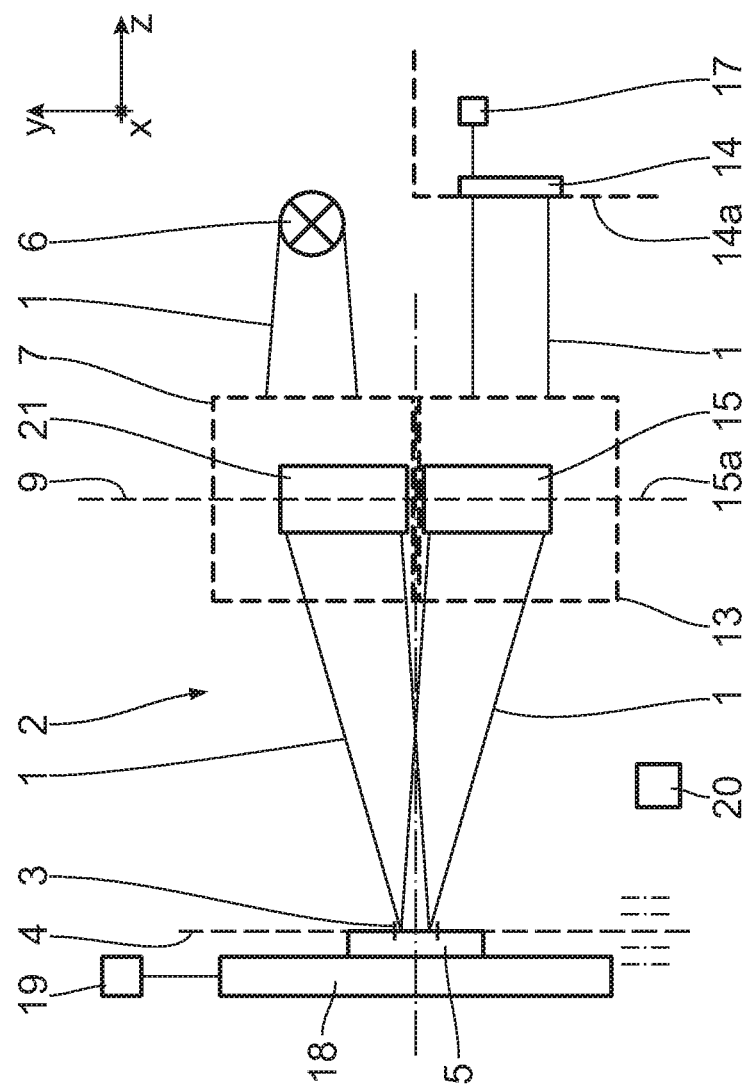
FIG. 1 shows highly schematically, in a plan view looking in a direction perpendicular to a plane of incidence, a metrology system for the examination of an object in the form of a lithography mask with EUV illumination and imaging light by use of an illumination optical unit and an imaging optical unit, each of which is represented extremely schematically.

In order to facilitate the presentation of positional relationships, a Cartesian xyz-coordinate system is used hereinafter. The x-axis extends perpendicularly to the plane of the drawing into the latter in FIG. 1. The y-axis extends upward in FIG. 1. The z-axis extends to the right in FIG. 1.

FIG. 1 shows in a view corresponding to a meridional section of a beam path of EUV illumination light and imaging light 1 in a metrology system 2 for the examination of an object 5, arranged in an object field 3 in an object plane 4, in the form of a reticle or a lithography mask with the EUV illumination light 1. The metrology system 2 is used for analyzing a three-dimensional (3D) aerial image (Aerial Image Metrology System) and serves for simulating and analyzing the effects of properties of lithography masks, known as reticles, which in turn are used during projection exposure for producing semiconductor devices, on the optical imaging by projection optical units within a projection exposure apparatus. Some of the components of such systems are known from US 2013/0063716 A1 (cf. FIG. 3 therein), from DE 102 20 815 A1 (cf. FIG. 9 therein) and from DE 102 20 816 A1 (cf. FIG. 2 therein) and from US 2013/0083321 A1.

The illumination light 1 is reflected at the object 5. A plane of incidence of the illumination light 1 lies parallel to the yz plane.

The EUV illumination light 1 is produced by an EUV light source 6. The light source 6 can be a laser plasma source (LPP; laser produced plasma), a discharge source (DPP; discharge produced plasma) or frequency-multiplied laser radiation. In principle, a synchrotron-based light source may also be used, for example a free electron laser (FEL).

A used wavelength of the EUV light source may lie in the range between 5 nm and 30 nm. In principle, in the case of a variant of the metrology system 2, a light source for another used wavelength may also be used instead of the light source 6, for example a light source for a used wavelength of 193 nm.

Depending on the configuration of the metrology system 2, it may be used for a reflecting object 5 or for a transmitting object 5. An example of a transmitting object is a phase mask.

An illumination optical unit 7 of the metrology system 2 is arranged between the light source 6 and the object 5. The illumination optical unit 7 serves for the illumination, with a defined illumination setting, of the object 5 to be examined with a defined illumination intensity distribution over the object field 3 and at the same time with a defined illumination angle distribution, with which the field points of the object field 3 are illuminated.

Figure 2:
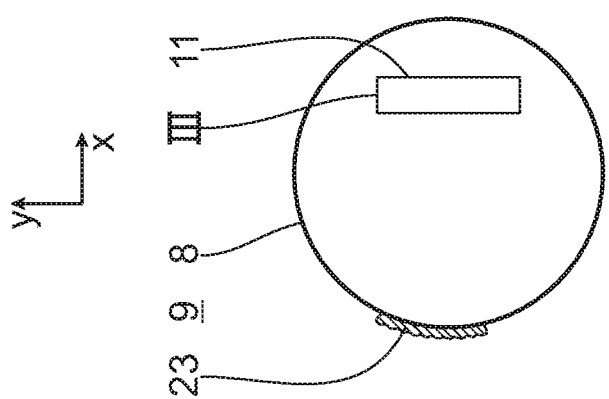
FIG. 2 shows a pupil of the illumination optical unit of the metrology system, arranged in a pupil plane.

FIG. 2 shows, in an exemplary manner, a pupil 8 of the illumination optical unit 7, which lies in a pupil plane 9 (cf. FIG. 1). The pupil 8 is illuminated to prescribe a specific illumination setting with a defined illumination light intensity distribution. So that the metrology system 2 illuminates the object 5 under exactly the same conditions as during the subsequent use of the object 5 in a projection exposure apparatus, an illumination setting that actually finds use during the projection exposure is predetermined here.

Figure 3:
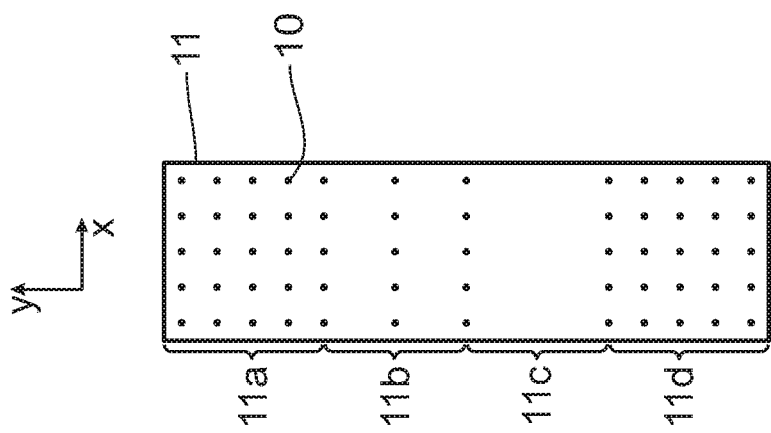
FIG. 3 shows a sectional magnification of the detail III in FIG. 2 with an illumination light intensity distribution over a portion of the pupil.

FIG. 3 shows a portion of such an exemplary illumination setting in the form of a raster of pupil illumination spots 10 in a portion 11 of the entire pupil 8 considered in FIG. 3. Such a distribution of pupil illumination spots 10 can be obtained, in particular, by the use of an illumination optical unit with at least one MEMS or MOEMS facet mirror. Such an illumination optical unit concept is used during the projection exposure but regularly not in a metrology system, and so the illumination intensity distribution is reproduced in a different way, as will still be explained below.

In the example illustrated in FIG. 3, the pupil portion 11 is rectangular and subdivided into a total of four square pupil segments 11a, 11b, 11c and 11d. The density of the pupil illumination spots 10 is greatest in the pupil segments 11a and 11d. The raster density of the pupil illumination spots 10 in the pupil segment 11b is a quarter of the raster density in the pupil segments 11a and 11d. There are no pupil illumination spots 10 in the pupil segment 11c. This pupil segment 11c therefore represents an example of a non-illuminated pupil portion.

Instead of the illumination setting that was explained above on the basis of FIGS. 2 and 3, it is also possible to use an illumination setting with a different illumination intensity distribution across the pupil 8, for example, a conventional illumination setting, an annular illumination setting, an X-dipole illumination setting, a Y-dipole illumination setting or else a quasar illumination setting. Examples of such illumination settings are found in DE 10 2008 021 833 A1. A further increasingly relevant class of settings are so-called free-form settings, which often emerge from optimizations of a wavefront propagation or of the object to be imaged (source mask optimization, SMO) and which can no longer be described as conventional ring segments. The arrangement and the density of the pupil illumination spots 10 are chosen depending on the illumination setting to be prescribed.

The possible illumination settings of a projection exposure apparatus, explained above, are reproduced in the metrology system 2 using EUV grey filters that are yet to be explained below.

After reflection at the object 5, the illumination and imaging light 1 enters an imaging optical unit or projection optical unit 13 of the metrology system 2, which in FIG. 1 is likewise schematically indicated by a dashed border. The imaging optical unit 13 serves for imaging the object 5 towards a spatially resolving detection device 14 of the metrology system 2. The detection device 14 is designed as a CCD detector or CMOS detector, for example. The detection device 14 captures the beam of the EUV illumination light 1 in an image plane 14a.

The imaging optical unit 13 comprises an imaging aperture stop 15 arranged downstream of the object 5 in the beam path for the marginal delimitation of an imaging light beam.

The imaging aperture stop 15 is arranged in a pupil plane 15a of the imaging optical unit 13. The pupil planes 9 and 15a may coincide; this is not mandatory however.

It is also possible to dispense with the imaging aperture stop 15 in the metrology system 2.

The detection device 14 is in signalling connection with a digital image processing device 17.

The object 5 is carried by an object holder 18. This object holder can be displaced by a displacement drive 19 on the one hand parallel to the xy plane and on the other hand perpendicularly to this plane, that is to say in the z direction. The displacement drive 19, as also the entire operation of the metrology system 2, is controlled by a central control device 20, which, in a way that is not represented any more specifically, is in signalling connection with the components to be controlled.

The optical set-up of the metrology system 2 serves for the most exact possible emulation of an illumination and an imaging in the course of a projection exposure of the object 5 during the projection-lithographic production of semiconductor devices.

Some of the basic components of the metrology system 2, explained above on the basis of FIG. 1, are known from WO 2016/012426 A1, for example.

Below, an embodiment of an EUV greyscale filter 21 is described on the basis of FIGS. 4 and 5, said greyscale filter being arranged in the pupil plane 9 of the illumination optical unit 7 of the metrology system 2. The greyscale filter 21 is embodied in such a way that, when illuminated by EUV illumination light 1 with an intensity that is constant over the pupil 8, an illumination intensity distribution integrated over the pupil segments 11a to 11d, which corresponds to the illumination setting according to FIG. 3, is achieved. To this end, the grey filter 21 is subdivided into filter portions 21a, 21b, 21c and 21d, which, in respect of their areal extent and arrangement, correspond to the pupil segments 11a, 11b, 11c and 11d.

The greyscale filter 21 has an unsupported carrier membrane 22 (cf. FIG. 5), which spans the entire area of the pupil 8. The carrier membrane 22 transmits the EUV illumination light 1 well and has a transmission for the EUV light that lies in the region of 90%. Depending on the embodiment of the carrier membrane 22, the transmission for the EUV illumination light is greater than 60%, greater than 65%, greater than 70%, greater than 75%, greater than 80% or else greater than 85%. The transmission of the carrier membrane 22 for the EUV illumination light 1 is less than 98% and, as a rule, less than 95%.

The carrier membrane 22 is arranged in such a way that it, in the assembled operational position of the greyscale filter 21, interacts at the site of the pupil 8 in the pupil plane 9, or in a plane conjugated thereto, with an entire beam of the EUV light. The carrier membrane 22 has no apertures or perforations, through which the EUV illumination light 1 can pass the membrane 22 without interaction. A layer thickness dM of the carrier membrane 22 lies at, e.g., 50 nm. Depending on the embodiment of the carrier membrane 22, the layer thickness dM can lie in the range of between, e.g., 10 nm and 100 nm. A main material of the carrier membrane 22 can be, e.g., polycrystalline silicon (pSi), monocrystalline silicon, silicon nitride ($Si_xN_y$), zirconium or graphene. In one embodiment of the carrier membrane 22 of polycrystalline silicon, the membrane 22 can be coated once more with a capping layer of, e.g., silicon nitride on at least one side or else on both sides. The carrier membrane 22 is unsupported within the meaning of not being supported by carrier means, i.e., not being applied to a membrane carrier, where it interacts with the beam of the EUV illumination light 1. At the edge, the carrier membrane 22 is held in regions, or over the entire circumference thereof, by a carrier frame 23, which is indicated schematically in portions in FIG. 2.

In order to vary a transmission or absorption or reflectivity over the surface of the carrier membrane 22, the grey filter has a coating 24 on the carrier membrane 22. Overall, the coating 24 has a layer thickness that varies over the area of the greyscale filter 21. This coating 24 is constructed from partial layers 24a, 24b, which are applied, for example sequentially, to the carrier membrane 22. The partial layers 24a, 24b are embodied as layers made of, e.g., silicon nitride ($Si_xN_y$), ruthenium, chromium, zirconium, SiO2, palladium, molybdenum, silicon, tantalum, tantalum nitride, TaON, titanium, titanium nitride, gold, nickel or boron and said partial layers lead to at least a partial absorption of the EUV illumination light 1 that interacts with these partial layers 24a, 24b.

Here, a lower partial layer 24a that is applied directly to the carrier membrane 22 covers the filter portions 21b and 21c. A second, upper partial layer 24b covers only the filter portion 21c. A structure of the greyscale filter 21, in which only the carrier membrane 22 interacts with the beam of the EUV illumination light 1 passing therethrough in the filter portions 21a and 21d, arises. Thus, the greyscale filter 21 has the highest transmission there, and so the highest illumination intensity is present in the pupil segments 11a and 11d. Thus, the filter portions 21a and 21d represent membrane maximum transmission surface regions of the carrier membrane 22. In the filter portion 21b, the partial layer 24a interacts with the illumination light 1, and so a reduced transmission is obtained there in comparison with the maximum transmission of the greyscale filter 21, i.e., to the transmission of the carrier membrane 22, for example a transmission in the region of 50%. In the filter portion 21c, the two partial layers 24a and 24b interact with the EUV illumination light 1, and so the lowest transmission for the EUV light is present there, for example a transmission that is less than 10% or, in the case of a complete block, a transmission of 0%.

Figure 5:
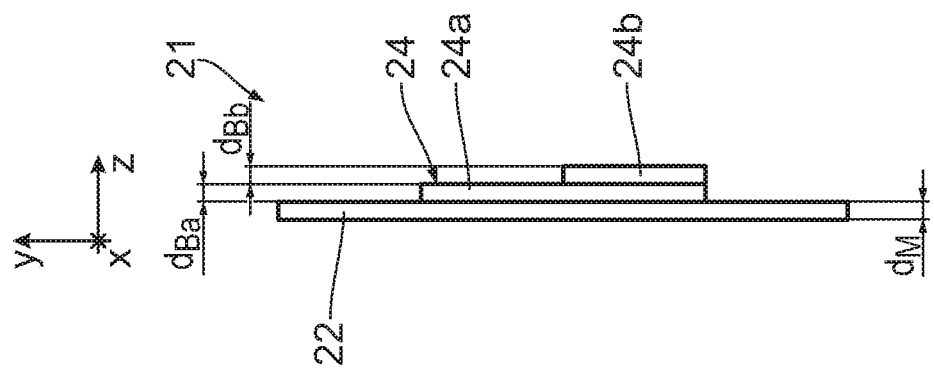
FIG. 5 shows a section according to the line IV-IV in FIG. 4 through the greyscale filter.
Figure 4:
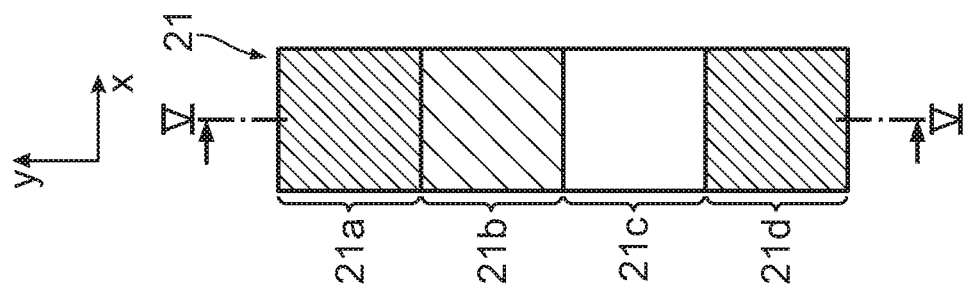
FIG. 4 shows a plan view of a section of an EUV greyscale filter, fitting to the pupil portion according to FIG. 3, having a membrane that is partly transmissive for EUV light, by means of which an illumination intensity distribution according to the pupil intensity distribution according to FIG. 3 can be produced qualitatively.

Thus, three different transmission levels are realized in the greyscale filter 21 according to FIGS. 4 and 5, namely a maximum transmission in the region of the filter portions 21a and 21d, a medium transmission in the region of the filter portion 21b and a lowest transmission in the region of the filter portion 21c. Depending on the number of partial layers 24i (i=a, b . . . ), the number of transmission levels can satisfy the requirements for emulating the illumination setting, up to a quasi-continuous adaptation to a transmission profile. The number of partial layers 24i can lie in the range between 1 and 5, for example. A greater number of partial layers 24i is also possible. The various partial layers 24i can each have the same layer thickness $d_B$, or else they can have different layer thicknesses. In the embodiment of the greyscale filter 21, the layer thickness $d_{Ba}$ of the partial layer 24a may be about half the size of the layer thickness $d_{Bb}$ of the partial layer 24b. In principle, the number of layer thicknesses of the partial layers can equal the number of partial layers; naturally, it can also be lower.

Below, FIGS. 6 to 9 are used to describe further embodiments of EUV greyscale filters, which can be used instead of the greyscale filter 21 of the embodiment according to FIGS. 4 and 5. Components and functions corresponding to those which have already been explained above with reference to FIGS. 1 to 5, and in particular with reference to FIGS. 4 and 5, bear the same reference signs and will not be discussed in detail again.

In the EUV greyscale filter 25 according to FIG. 6, a total of four partial layers 24a, 24b, 24c, 24d of the coating 24 are present on the carrier membrane 22. In the greyscale filter 25, the carrier membrane 22 has been illustrated excessively thick in comparison with the partial layers 24a to 24d.

Including the maximum transmission level in regions in which only the carrier membrane 22 interacts with the EUV illumination light 1, the greyscale filter 25 realizes a total of five different transmission levels. This allows a precise emulation even of pupil-intensity profiles with a complex profile, which can be used for emulating correspondingly complex illumination settings during the projection exposure.

In principle, it is possible to apply the coating 24 on both sides of the carrier membrane 22 as well, as indicated using dashed lines at 24e in FIG. 6.

FIG. 7 shows an embodiment of an EUV greyscale filter 26, in which a coating 27 with a continuous layer thickness profile is realized on the carrier membrane 22 instead of a coating with partial layers of discrete thicknesses. By way of this continuous layer thickness profile, it is possible to achieve a correspondingly continuous transmission or reflectivity profile of the greyscale filter 26.

Partial layers in the style of the partial layers 24a, 24b of the greyscale filter 21 or in the style of the partial layers 24a to 24d of the greyscale filter 25 can be realized by using appropriately designed stops during a coating method on the carrier membrane 22.

Alternatively, corresponding partial layers 24i can also be produced with the aid of a screen printing method. Then, the partial layers 24i can be set in respect of their transmission by way of varying coating point densities. Then, each of the partial layers 24i can have, in principle, a distribution of layer spots that, in terms of the arrangement, corresponds to that described above in conjunction with the pupil illumination spots 10 (cf. FIG. 3). Then, a greatest arrangement density of such filter spots for achieving a lowest transmission there would be present in the filter portion 21c. In the filter portion 21b, the arrangement density of the filter spots would be lower in comparison therewith, and so a medium transmission would be achieved. The respective arrangement density of the filter spots can be predetermined by the screen printing method.

Referring to FIG. 8, in the EUV greyscale filter 28, there is no coating in the style of the coatings 24, 26 of the embodiments according to FIGS. 5 to 7. The surface of the membrane 22 has a patterning 29 for varying an absorption or transmission or a reflectivity of the greyscale filter 28. In the greyscale filter 28, a step-wise material ablation is realized in a manner comparable to the step-wise partial layers 24a to 24d of the greyscale filter 25, wherein a total of four ablation levels 29a, 29b, 29c and 29d are realized. In addition to the regions in which the carrier membrane 22 is present without material ablation, a total of, once again, five transmission levels of the greyscale filter 28 can be realized by way of these ablation levels 29a to 29d.

In the greyscale filter 30 according to FIG. 9, a continuous material ablation of the carrier membrane 22 is realized, and so a continuous transmission profile, corresponding to what was explained above in conjunction with the greyscale filter 26 according to FIG. 7, is obtained there.

The material ablation of the carrier membrane for the purposes of producing the greyscale filters 28, 30 can be obtained by way of an abrasive method, for example an ion beam method, for example using an IBF (ion beam figuring) apparatus or else with the aid of an electron beam ablation. A targeted material ablation can also be obtained with the aid of a photolithographic method.

In principle, the above-described, basic variants of "coating" and "material ablation" for producing a prescribed transmission profile of the greyscale filter can also be combined with one another in such a way that a photoresist is applied onto the carrier membrane 22 overall, said photoresist then being patterned in a targeted manner, i.e., etched away either for producing discrete layer thickness regions or for producing a continuous layer thickness profile.

By way of example, the metrology system 2 can be used for 3D aerial-image measurement. Data that can be used to deduce an imaging behaviour of the structure of the object 5 that is illuminated in the object field 3 by a projection optical unit of an EUV projection exposure apparatus in the region of an image plane are generated during the 3D aerial-image measurement. The metrology system 2 is used to this end. Such a method for 3D aerial-image measurement is described, in principle, in WO 2016/012426 A1.

The use of the various greyscale filter embodiments for reproducing an illumination setting of an EUV projection exposure apparatus in a metrology system was described above. By way of example, it is possible to realize a pupil obscuration in the projection optical unit of the EUV projection exposure apparatus, for example in a scanner.

Alternatively, or additionally, it is possible to realize an intensity profile correction in the pupil of the metrology system 2 or a corresponding adjustment to a correction pupil intensity profile within the EUV projection exposure apparatus to be emulated. By way of example, an edge-sided decrease of a pupil intensity, for example on account of apodization, can be prescribed.

As an alternative or in addition thereto, the above-described variants of the EUV greyscale filter can also be used to correct intensity profiles in the illumination field, i.e., in the object field and/or in the image field, firstly, in the metrology system 2 and/or within an EUV projection exposure apparatus. To this end, the greyscale filter is introduced into a field plane (e.g., object plane 4 or image plane 14a) or a near-field plane. Then, the function of the greyscale filter can correspond to a device for optimizing the uniformity of the intensity profile, which is described in, e.g., WO2016/128253 A1 and EP 0 952 491 A2. Such a device is also know as a UNICOM (uniformity control module).

A further application option for the greyscale filters lies in setting imaging conditions in order to increase a sensitivity of the imaging on specific object structures. Then, the greyscale filter can be used as a pupil filter. A possible application case in this case is the dark field imaging, which can be used, for example, for detecting defects against a uniform background.

In addition to a use in a pupil plane or near-pupil plane or a use in a field plane or near-field plane, such an EUV greyscale filter can also be used in a neither near-pupil nor near-field plane. The position of such a neither near-pupil nor near-field plane can be characterized with the aid of a field position parameter P, which is defined in WO 2009/024164 A. In some examples the greyscale filter is positioned optically remote from the pupil plane. Where the greyscale filter is placed at a position sufficiently remote from the pupil plane it is generally possible to influence different field points differently from each other such that field-dependent variations can be corrected or reduced. The greyscale filter may be positioned at a position in which P<1 is fulfilled, in which $$P=D(SA)/(D(SA)+D(CR)),$$

where D(SA) is a diameter of a sub-aperture of a ray bundle originating from a field point in the object surface on a respective surface; and D(CR) is a maximum distance of chief rays of an effective object field imaged by the optical system measured in a reference plane of the optical system. The reference plane may be a symmetry plane of the optical system. In systems having a meridional plane, the reference plane may be the meridional plane. As the diameter of a sub-aperture approaches zero at the field plane, the parameter P=0 in the field plane. In contrast, the maximum distance of chief rays, D(CR), approaches zero in the pupil plane. Therefore, the condition P=1 is fulfilled for a position exactly in the pupil plane. In some embodiments the condition P<0.99 holds for a position optically remote from the pupil plane. The following can apply to the arrangement plane of the greyscale filter: $0.3 \leq P \leq 0.7$. For the case of an arrangement of the EUV greyscale filter in a pupil plane or near-pupil plane, P>0.7 and, in particular, P>0.95 can apply. The EUV greyscale filter can be securely installed, coupled to a manipulator and embodied in an interchangeable manner or in a manner that is pivotable into the beam path.

What is claimed is:

1. A metrology system comprising:
    an EUV light source configured to provide EUV light having a wavelength in a range from 5 nm to 30 nm;
    an EUV optical unit having an EUV greyscale filter, the EUV greyscale filter comprising:
        a membrane that is at least partly transmissive in regions for the EUV light, in which said membrane is configured to interact with a whole beam of the EUV light in an operational position of the EUV greyscale filter located along an optical path of the EUV light at a position between the EUV light source and an object illuminated by the EUV light, wherein at least two different transmission levels are realized over a varying thickness of the EUV greyscale filter; and
    a spatially resolving detection device for metrology, in which the spatially resolving detection device is configured to detect the EUV light that interacts with the EUV greyscale filter and the object and generate an aerial image of the object.

2. The metrology system according to claim 1, wherein the membrane of the EUV greyscale filter has a maximum transmission for the EUV light that is greater than 60% in a membrane maximum transmission surface region.

3. The metrology system according to claim 1, comprising a patterning of a surface of the membrane of the EUV greyscale filter for varying an absorption or reflectivity over a surface of the membrane.

4. The metrology system according to claim 1, comprising a coating of a surface of the membrane of the EUV greyscale filter for varying an absorption or reflectivity over a surface of the membrane.

5. The metrology system according to claim 4, wherein the coating has a varying layer thickness.

6. The metrology system according to claim 1, wherein the EUV greyscale filter is arranged in a pupil plane of the EUV optical unit.

7. The metrology system according to claim 1, wherein the EUV greyscale filter is arranged in a field plane of the EUV optical unit.

8. The metrology system of claim 1 in which the membrane comprises at least one of polycrystalline silicon (pSi), monocrystalline silicon, silicon nitride (SixNy), zirconium, or graphene.

9. The metrology system of claim 1 in which the membrane has a varying layer thickness.

10. The metrology system of claim 1 in which the membrane comprises a coating having partial layers of discrete thicknesses,
    at a first region of the membrane the coating has a single partial layer, a lower thickness, and a higher transmission level, and
    at a second region of the membrane the coating has at least two partial layers, a higher thickness, and a lower transmission level.

11. The metrology system of claim 1 in which the membrane comprises a coating that has varying coating point densities,
    at a first region of the membrane the coating has a lower coating point density and a higher transmission level, and
    at a second region of the membrane the coating has a higher coating point density and a lower transmission level.

12. The metrology system of claim 1 in which the membrane comprises a patterned photoresist layer,
    a first region of the photoresist layer having a higher transmission level, and
    a second region of the photoresist layer having a lower transmission level.

13. The metrology system of claim 1 in which the detector comprises a CCD detector or a CMOS detector.

14. The metrology system of claim 1 in which the membrane comprises a first coating having partial layers of discrete thicknesses,
    at a first region of the membrane the first coating has a single partial layer, a lower thickness, and a higher transmission level, and
    at a second region of the membrane the first coating has at least two partial layers, a higher thickness, and a lower transmission level,
    wherein the membrane comprises a second coating that has varying coating point densities,
    at a first region of the membrane the second coating has a lower coating point density and a higher transmission level, and
    at a second region of the membrane the second coating has a higher coating point density and a lower transmission level.

15. The metrology system of claim 14 in which the membrane comprises a patterned photoresist layer,
    a first region of the photoresist layer having a higher transmission level, and
    a second region of the photoresist layer having a lower transmission level.

16. An apparatus comprising:
    an EUV greyscale filter configured to be used in a metrology system, the EUV greyscale filter comprising a membrane that is at least partly transmissive in regions for EUV light having a wavelength in a range from 5 nm to 30 nm, in which the membrane comprises a first coating having partial layers of discrete thicknesses, at a first region of the membrane the first coating has a single partial layer, a lower thickness, and a higher transmission level, and at a second region of the membrane the first coating has at least two partial layers, a higher thickness, and a lower transmission level.

17. The apparatus of claim 16 in which the membrane comprises a second coating that has varying coating point densities, at a first region of the membrane the second coating has a lower coating point density and a higher transmission level, and at a second region of the membrane the second coating has a higher coating point density and a lower transmission level.

18. The apparatus of claim 16 in which the membrane of the EUV greyscale filter has a maximum transmission for the EUV light that is greater than 60% in a membrane maximum transmission surface region.

19. An apparatus comprising:

an EUV greyscale filter configured to be used in a metrology system, the EUV greyscale filter comprising a membrane that is at least partly transmissive in regions for EUV light having a wavelength in a range from 5 nm to 30 nm, in which the membrane comprises a coating that has varying coating point densities, at a first region of the membrane the coating has a lower coating point density and a higher transmission level, and at a second region of the membrane the coating has a higher coating point density and a lower transmission level.

20. The apparatus of claim 19 in which the membrane of the EUV greyscale filter has a maximum transmission for the EUV light that is greater than 60% in a membrane maximum transmission surface region.

* * * * *